United States Patent [19]
Gil

[11] Patent Number: 6,001,692
[45] Date of Patent: Dec. 14, 1999

[54] METHOD OF FABRICATING TRENCH MOS

[75] Inventor: Gyoung Seon Gil, Kunsan-si, Rep. of Korea

[73] Assignee: LG Semicon Co., Ltd., Chungcheongbuk, Rep. of Korea

[21] Appl. No.: 08/926,027

[22] Filed: Sep. 9, 1997

[30] Foreign Application Priority Data

Oct. 22, 1996 [KR] Rep. of Korea ..................... 96/47452

[51] Int. Cl.⁶ ................................. H01L 21/336
[52] U.S. Cl. .................... 438/279; 438/270; 438/275; 438/259
[58] Field of Search .................... 438/199, 275, 438/279, 259, 270, FOR 168, FOR 172, FOR 208, FOR 216, FOR 217, FOR 218

[56] References Cited

U.S. PATENT DOCUMENTS

| 4,580,330 | 4/1986 | Pollack et al. | 29/576 W |
|---|---|---|---|
| 5,049,515 | 9/1991 | Tzeng | 437/43 |
| 5,083,173 | 1/1992 | Yamada et al. | |
| 5,180,680 | 1/1993 | Yang | 437/38 |
| 5,414,287 | 5/1995 | Hong | 257/316 |
| 5,460,989 | 10/1995 | Wake | 437/43 |
| 5,780,340 | 7/1998 | Garder et al. | 438/259 |
| 5,801,416 | 9/1998 | Choi et al. | 257/335 |

*Primary Examiner*—Wael Fahmy
*Assistant Examiner*—Long Pham
*Attorney, Agent, or Firm*—Morgan, Lewis & Bockius LLP

[57] ABSTRACT

A semiconductor device includes a substrate, a plurality of active regions on the substrate, the active regions having recessed and elevated types and being alternatively in parallel with the substrate, respectively, and a plurality of first and second field insulating layers at field regions adjacent to the active regions, the first field insulating layer being parallel with the substrate and the second field insulating layer being perpendicular to the substrate.

8 Claims, 7 Drawing Sheets

METHOD OF FABRICATING TRENCH MOS

This application claims the benefit of Korean Application No. 47452/1996 filed Oct. 22, 1996, which is hereby incorporated by reference.

BACKGROUND OF THE INVENTION

1. Field of the Invention

The present invention relates to a semiconductor device, and more particularly, to a structure of a semiconductor device and method of fabricating the same. Although the present invention is suitable for a wide range of applications, it is particularly suitable for a highly integrated transistor.

2. Discussion of the Related Art

A conventional structure of a semiconductor device and method of fabricating the same will be explained with reference to the attached drawings.

FIG. 1 is a cross-sectional view of a conventional structure of a semiconductor device. A field oxide layer 15 is formed at a field region of a semiconductor substrate 11 defined as an active region and a field region. A gate insulating layer 16 is formed on a predetermined portion of the active region and a gate electrode 19 is formed on the gate insulating layer 16. Sidewall spacers 21 are formed on both sides of the gate insulating layer 16 and the gate electrode 19, and a source/drain impurity diffusion region 22 having a LDD (lightly doped drain) structure is formed in the substrate 11 on each side of the gate electrode 19 adjacent to the sidewall spacers 21.

FIGS. 2A–2E are cross-sectional views showing a conventional method of fabricating a semiconductor device having the aforementioned structure. First, an initial oxide layer 12 is formed in order to release stress imposed on an interface of a semiconductor substrate and a nitride layer 13 is deposited on the entire surface of the initial oxide layer 12, as shown in FIG. 2A.

Subsequently, a first photo resist layer 14, as shown in FIG. 2B, is coated on the nitride layer 13 and then is patterned by an exposure and development process. Using the patterned first photo resist layer 14 as a mask, the nitride layer 13 is partially removed to define a field region and an active region. A region where the nitride layer 13 has been removed is defined as a field region, whereas a region below the remaining nitride layer 13 is defined as an active region. Using the first photo resist layer 14 as a mask, ions are implanted into the field region to increase the insulation characteristic of the field region. In this process, by increasing the concentration of the implanted ions, the value of the threshold voltage can be increased.

Referring to FIG. 2C, the first photo resist layer 14 used as a mask for ion implantation is removed. Using the nitride layer 13 as a mask, an oxidation process is carried out to form a field oxide layer 15 in the field region. The nitride layer 13 and the initial oxide layer 12 are removed. A gate insulating layer 16 is formed on the surface of the substrate 11 between the field oxide layers 15 and then a polysilicon layer 17 for a gate electrode is formed on the entire surface of the gate insulating layer 16. Thereafter, a second photo resist layer 18 is provided on the polysilicon layer 17 and patterned by an exposure and development process.

Referring to FIG. 2D, using the second photo resist layer 18 as a mask, the polysilicon layer 17 and the gate insulating layer 16 are partially removed so that a gate electrode 19 is formed. Using the gate electrode 19 as a mask, impurity ions are lightly implanted into the entire surface of the substrate 11 to form a lightly doped impurity regions 20 in the substrate 11.

Finally, as shown in FIG. 2E, an insulating layer (not shown) is deposited on the entire surface including the gate electrode 19 and is subjected to etch back to form sidewall spacers 21 on both sides of the gate insulating layer 16 and the gate electrode 19. After forming the sidewall spacers 21, impurity ions are heavily implanted into the substrate 11 using the gate electrode 19 and the sidewall spacers 21 as masks to form a source/drain impurity region 22 having a LDD structure.

Nevertheless, a conventional structure of a semiconductor device and method of fabricating the same has the following problems.

Since a field oxide layer used as an isolation region for isolating devices occupies a large area, it is not feasible for fabricating highly integrated devices.

SUMMARY OF THE INVENTION

Accordingly, the present invention is directed to a structure of a semiconductor device that is suitable for a highly integrated transistor and a method of fabricating the same that substantially obviate one or more of problems due to limitations and disadvantages of the related art.

An object of the invention is a semiconductor device in which a field oxide layer is formed vertically to occupy a minimal area and a method of fabricating the same.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the semiconductor device includes a semiconductor substrate, a plurality of active regions of concave type and convex type formed alternatively on a semiconductor substrate, and field insulating layers some of which are formed to be parallel with the semiconductor substrate and the other of which are formed to be perpendicular to the semiconductor substrate in active regions and field regions.

In another aspect of the invention, the method of fabricating the semiconductor device includes the steps of providing a semiconductor substrate, forming a plurality of active regions of concave type and convex type formed alternatively on the semiconductor substrate, and forming field insulating layers some of which are formed to be parallel with the semiconductor substrate and the other of which are formed to be perpendicular to the semiconductor substrate in field regions and active regions.

In another aspect of the invention, the semiconductor device including a substrate, a plurality of active regions formed in rows and columns in the substrate, one active region of each adjacent pair of active regions in a row being formed in a trench in the substrate, the trench including first and second walls extending in a direction perpendicular to the row, and a field insulating layer on each of the first and second walls.

In another aspect of the invention, the semiconductor device includes a substrate, a plurality of active regions formed in rows and columns in the substrate, each of the active regions in a row being at a vertical level in the substrate different from the vertical level of an adjacent active region in a row, and a field insulating layer separating adjacent active regions in a row, each of the field insulating layers having a thickness in the direction of a row and a height in a direction perpendicular to the substrate and to the thickness of the layer, the height of each of the field insulating layer being greater than the thickness thereof.

In another aspect of the invention, the method of fabricating a semiconductor device having a substrate, the device includes the steps of forming a plurality of active regions on the substrate, the active regions having recessed and elevated types and being alternatively in parallel with the substrate, respectively, and forming a plurality of first and second field insulating layers at field regions adjacent to the active regions.

In a further aspect of the invention, the method of fabricating a semiconductor device having a substrate comprising the steps of forming a first photo resist layer on the substrate, patterning the first photo resist layer to expose a portion of the substrate, forming a trench in the substrate using the patterned photo resist as a mask, removing the photo resist layer, forming a first insulating layer on the substrate including the trench, executing an etch back process to the first insulating layer to form sidewall spacers on sides of the trench, forming a second insulating layer on the substrate including the sidewall spacers, annealing the second insulating layer and the sidewall spacers to form a plurality of channel stop regions, removing the sidewall spacers and the second insulating layer, forming a buffer layer on the substrate, forming an oxide resist layer on the buffer layer, forming a second photo resist layer on the oxide resist layer, patterning the second photo resist layer to expose a portion of the oxide resist layer, partially removing the oxide resist layer using the second photo resist layer as a mask, forming a plurality of field oxide layers from the buffer layer using the oxide resist layer as a mask, removing the buffer layer and the oxide resist layer, forming a gate insulating layer on the substrate including the field oxide layer, forming a polysilicon layer on the gate insulating layer, forming a third photo resist layer on the polysilicon layer, patterning the third photo resist layer to expose a portion of the polysilicon layer, partially removing the polysilicon layer on the gate insulating layer to form a gate electrode, and implanting impurity ions to form a source and drain region in the substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and, together with the description, serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

A structure of a semiconductor device and method of fabricating the same will be explained with reference to the accompanying drawings.

Figure 1:
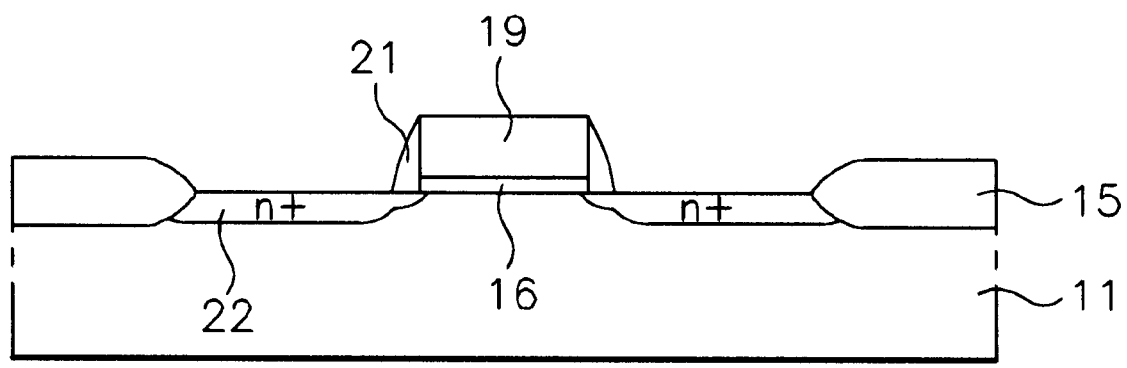
FIG. 1 is a cross-sectional view showing a structure of a conventional semiconductor device.
Figure 2A:
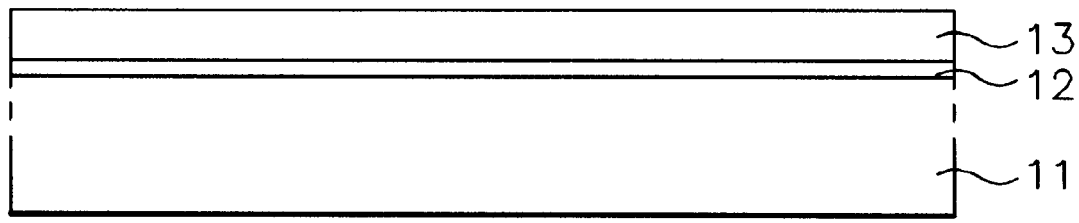
FIGS. 2A–2E are cross-sectional views showing a conventional method of fabricating a semiconductor device.
Figure 2B:
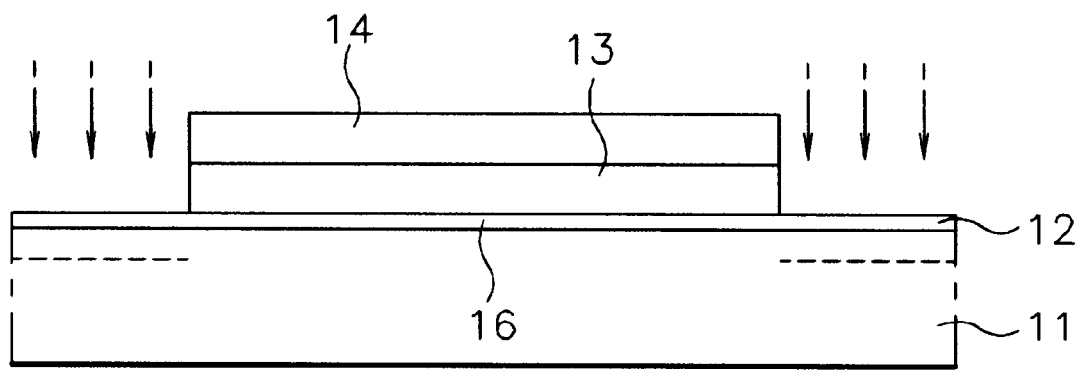
Figure 2C:
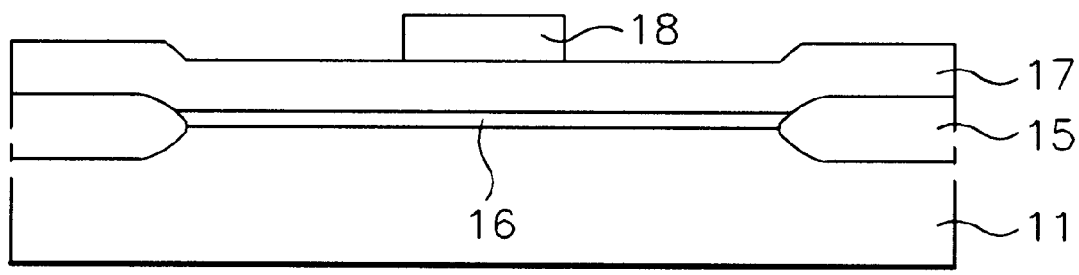
Figure 2D:
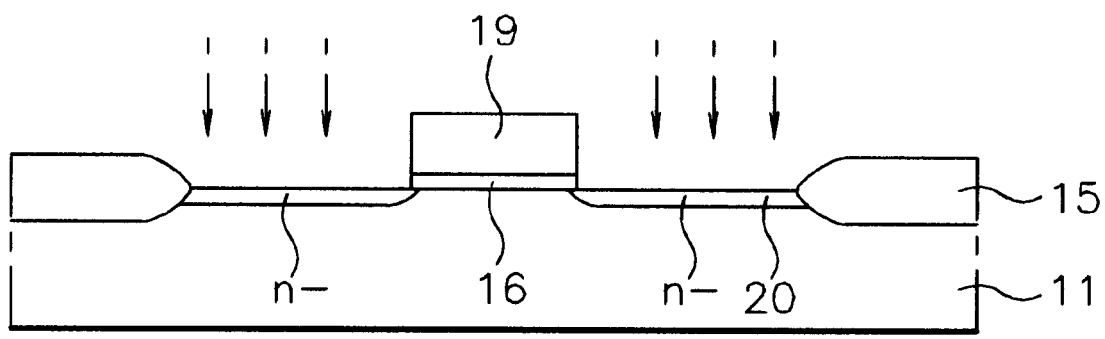
Figure 2E:
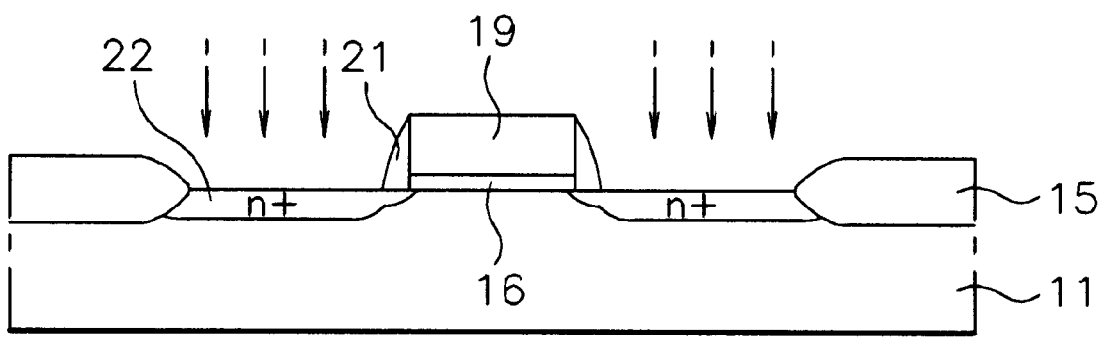
Figure 3:
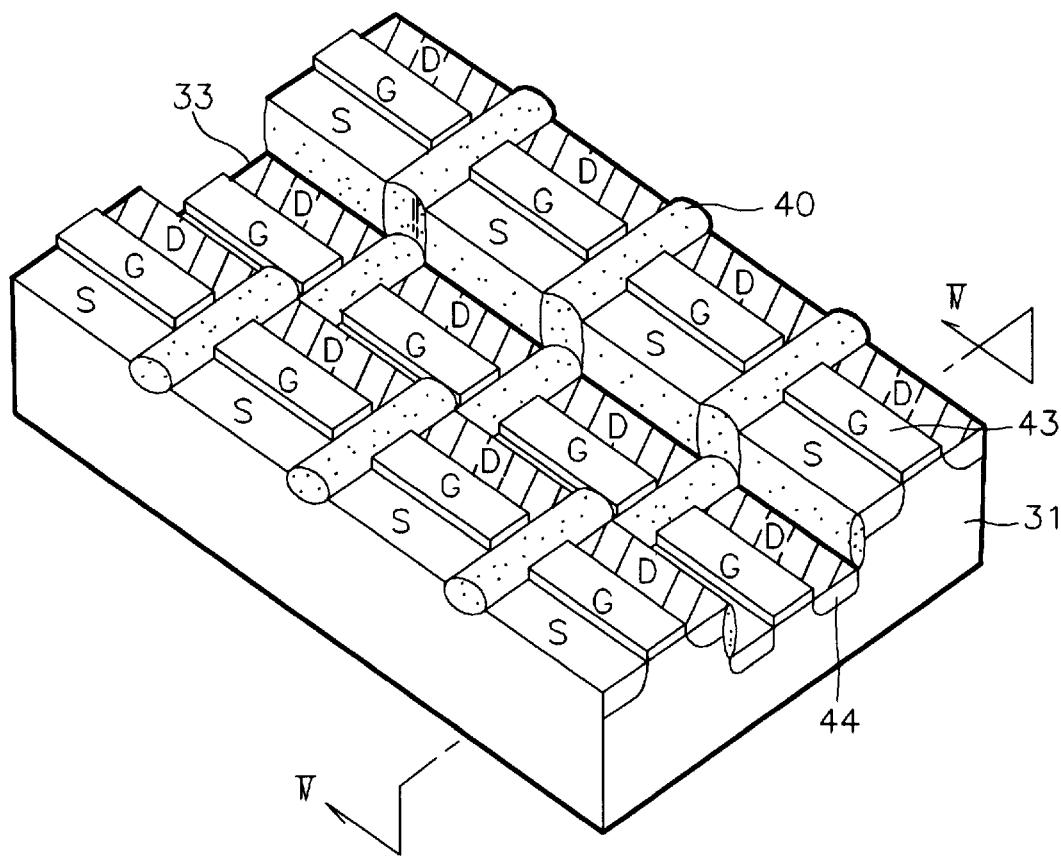
FIG. 3 is a perspective view of a semiconductor device in accordance with a first embodiment of the present invention.

FIG. 3 illustrates a perspective view of a semiconductor device in accordance with a first embodiment of the present invention. A trench 33 is formed in one direction in a semiconductor substrate 31 and spaced-apart field oxide layers 40 are formed perpendicularly to the trench 33 and to the sidewalls of the trench 33. A plurality of gate electrodes 43 are also formed in an active region isolated by the field oxide layers 40 and a source/drain impurity region 44 is formed on both sides of the gate electrode 43.

Figure 4:
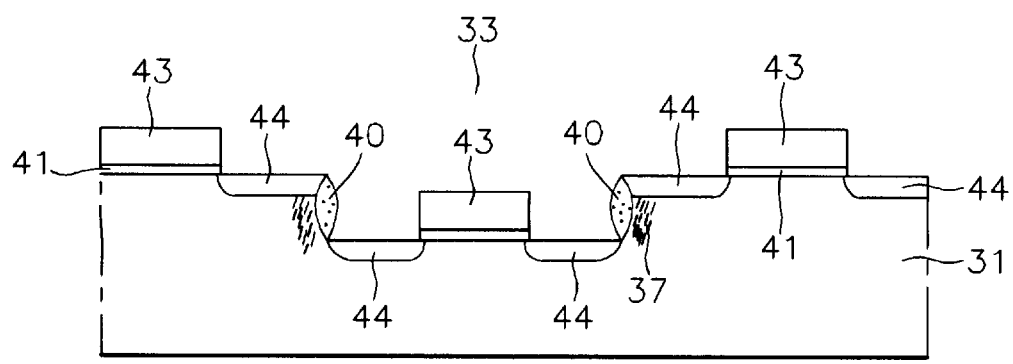
FIG. 4 is a cross-sectional view taken along line IV—IV in FIG. 3 showing a structure of the first embodiment of the present invention.

FIG. 4 illustrates a structure of a semiconductor device taken along line IV—IV in FIG. 3. As shown in FIG. 4, a trench 33 is formed to a predetermined depth in a semiconductor substrate 31. A channel stop region 37 is formed on each side of the trench 33 in a direction perpendicular to the trench 33 and a field oxide layer 40 is formed on the vertical lateral side of the channel stop region 37. The field oxide layer 40 is also perpendicular to the trench 33.

The structure of the device also includes a gate insulating layer 41 on predetermined portions of the trench 33 and the substrate 31, gate electrodes 43, and source/drain impurity regions 44 on the substrate 31 on both sides of the gate electrodes 43.

A method of fabricating a semiconductor device having an aforementioned structure will be explained below.

Figure 5A:
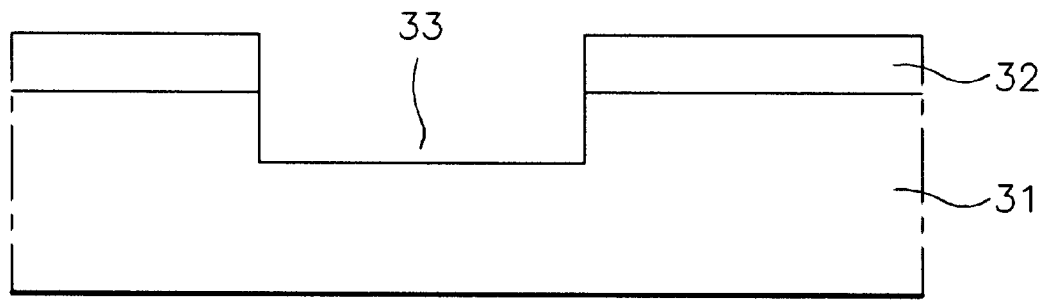
FIGS. 5A–5F are cross-sectional views showing a method of fabricating a semiconductor device according to the first embodiment of the present invention.

FIGS. 5A–5F illustrate a method of fabricating a semiconductor device according to the first embodiment of the invention. First, as shown in FIG. 5A, a photoresist layer 32 is coated on the entire surface of a substrate 31 and patterned by an exposure and development process. Using the patterned photo resist layer 32 as a mask, a plurality of trenches 33 having a predetermined depth is formed in the substrate 31.

Figure 5B:
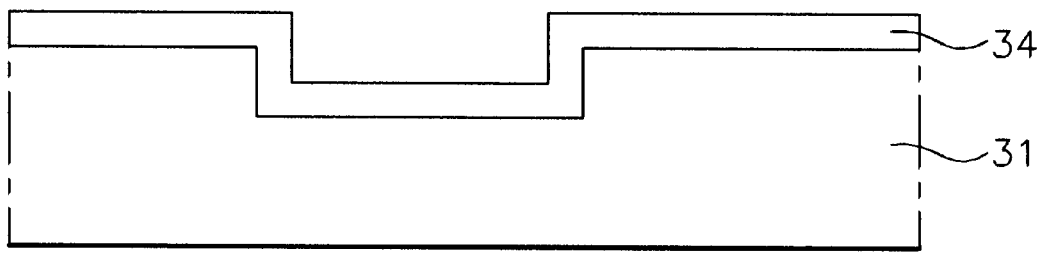

Referring to FIG. 5B, the photo resist layer 32 is removed and a first insulating layer 34 is then formed on the entire surface of the substrate 31 including the trench 33 by a CVD (chemical vapor deposition) process. When the substrate 31 is an n-type, the first insulating layer 34 is an undoped insulating layer such as BSG (Boron Silicate Glass). On the other hand, when the substrate 31 is a p-type, the first insulating layer 34 is an insulating layer containing impurities of PSG (Phosphorous Silicate Glass).

Figure 5C:
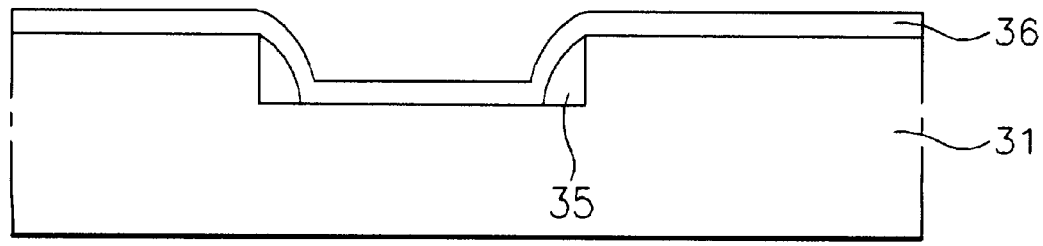

Next, as shown in FIG. 5C, an etch back process is executed to the first insulating layer 34 so that only sidewall spacers 35, formed on both sides of the trench 33, remain. Thereafter, a second insulating layer 36 is formed on the entire surface of the substrate including on the sidewall spacers 35 by using a CVD process. The second insulating layer 36 is an undoped insulating layer for preventing out-diffusion of dopant in the substrate.

Figure 5D:
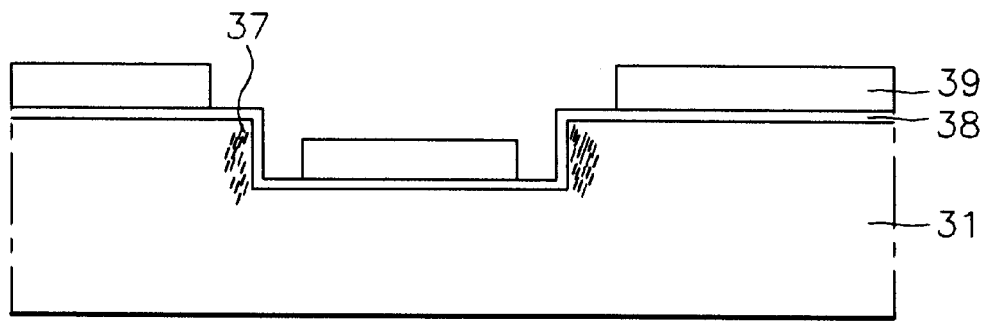

Referring to FIG. 5D, the sidewall spacers 35 and the second insulating layer 36 are annealed so that channel stop regions 37 are formed along the sides of trenches 33. The sidewall spacers 35 and the second insulating layer 36 are then removed. In this process, the channel stop regions 37 are formed through thermal diffusion caused by the annealing process over the sides of the trenches 33. A pad oxide layer 38, which functions as a buffer layer is formed on the entire surface and then a nitride layer 39, which functions as an oxide resist layer, is formed on the pad oxide layer 38. A photo resist layer (not shown) is then coated on the nitride layer 39 and patterned by an exposure and development process. Subsequently, using the patterned photo resist layer as a mask, the nitride layer 39 is partially removed as shown in FIG. 5D.

Figure 5E:
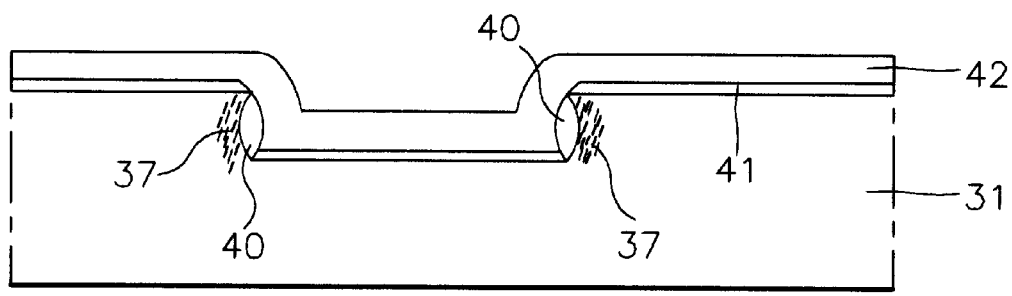
Figure 5F:
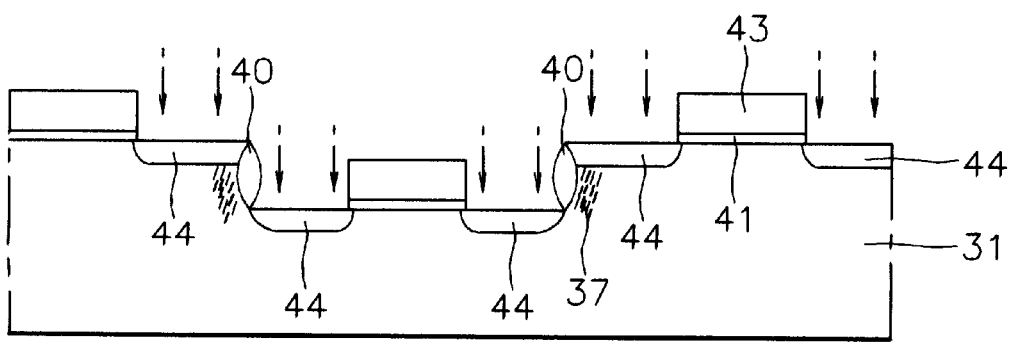

Referring to FIG. 5E, using the nitride layer 39 as a mask, field oxide layers 40 are formed over the channel stop regions 37 by a LOCOS (local oxidation of silicon) process. The nitride layer 39 and the pad oxide layer 38 are then removed. A gate insulating layer 41 is formed on the entire surface of the substrate including the field oxide layers 40 and then a polysilicon layer 42 for a gate electrode is formed on the gate insulating layer 41. For example, the gate insulating layer 41 includes an oxide layer. Since the gate insulating layer 41 and the field oxide layers 40 are the same material, the gate insulating layer 41 deposited on the field oxide layers 40 is not shown in FIG. 5E.

Finally, a photoresist layer (not shown) is coated on the polysilicon layer 42 and patterned by an exposure and development process. Using the patterned photo resist layer as a mask, the polysilicon layer 42 and the gate insulating layer 41 are partially removed to form gate electrodes 43. After forming the gate electrodes 43, impurity ions are implanted using the gate electrodes 43 as masks to form a source/drain impurity regions 44 in the substrate 31 on both sides of the gate electrodes 43.

Figure 6:
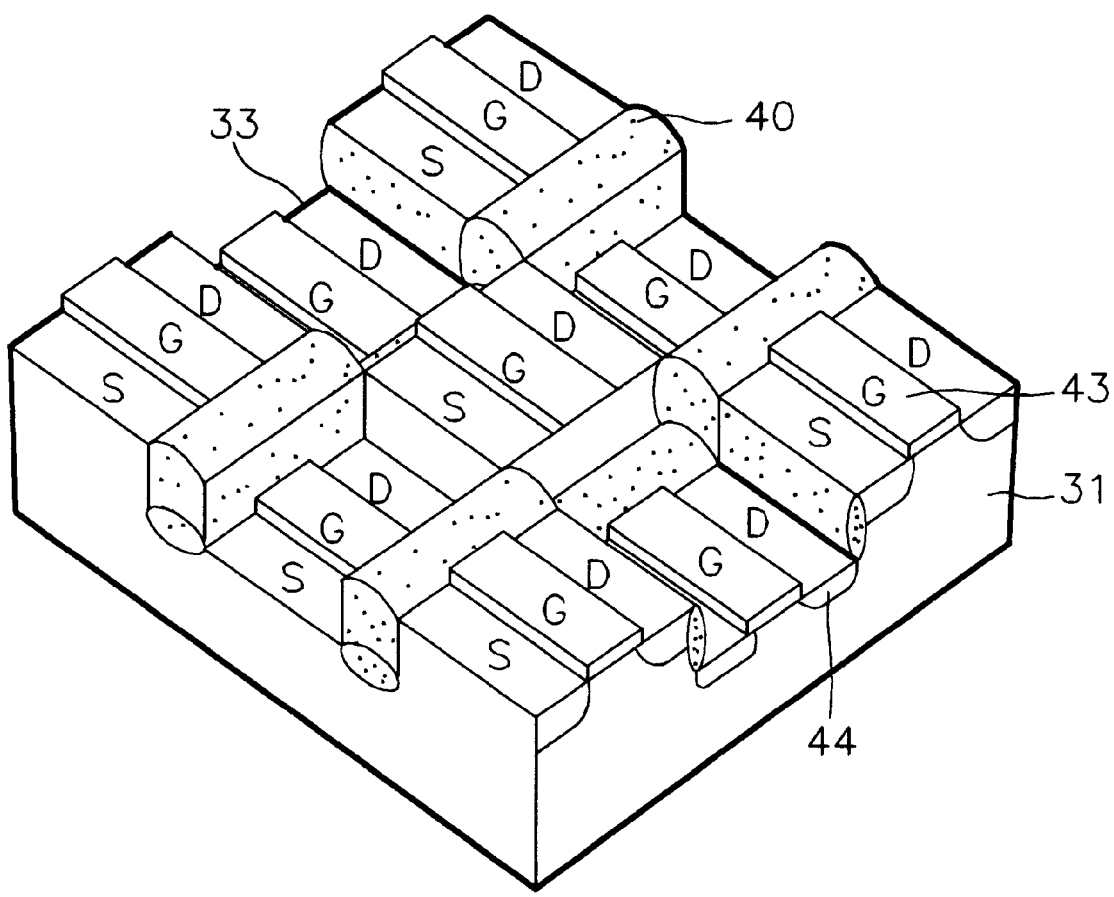
FIG. 6 is a perspective view of a semiconductor device in accordance with a second embodiment of the present invention.

FIG. 6 illustrates a perspective view of a semiconductor device according to a second embodiment of the invention. As shown in FIG. 6, a plurality of trenches 33, like a checkerboard pattern, is formed on the substrate 31. Field oxide layers 40 are formed along the vertical sides of each of the trenches 33. Gate electrodes 43 are formed in active regions isolated by the field oxide layers 40. Source/drain impurity region 44 are formed in the substrate on both sides of the gate electrode 43.

In accordance with the invention, the field oxide layer is grown vertically along the sides of the trenches to provide junction isolation, but yet require a minimal distance between the junctions while preventing junction breakdown. This results in diminishing the area required for separation.

It will be apparent to those skilled in the art that various modification and variations can be made in the semiconductor device and method of fabricating the same of the present invention without departing from the spirit or scope of the inventions. Thus, it is intended that the present invention cover the modifications and variations of this invention provided they come within the scope of the appended claims and their equivalents.

What is claimed is:

1. A method of fabricating a semiconductor device having a substrate, the method comprising the steps of:

forming a first photo resist layer on the substrate;

patterning the first photo resist layer to expose a portion of the substrate;

forming a trench in the substrate using the patterned photo resist as a mask;

removing the photo resist layer;

forming a first insulating layer on the substrate including the trench;

executing an etch back process to the first insulating layer to form sidewall spacers on sides of the trench;

forming a second insulating layer on the substrate including the sidewall spacers;

annealing the substrate including the second insulating layer and the sidewall spacers to form a plurality of channel stop regions by diffusing dopants in the substrate onto the sides of the trench;

removing the sidewall spacers and the second insulating layer;

forming a buffer layer on the substrate;

forming an oxide resist layer on the buffer layer;

forming a second photo resist layer on the oxide resist layer;

patterning the second photo resist layer to expose a portion of the oxide resist layer;

partially removing the oxide resist layer using the second photo resist layer as a mask;

forming a plurality of field oxide layers from the buffer layer around the sides of the trenches using the oxide resist layer as a mask;

removing the buffer layer and the oxide resist layer;

forming a gate insulating layer on the substrate including the field oxide layer.

2. The method according to claim 1, wherein the first insulating layer in the step of forming the first insulating layer includes a Boron Silicate Glass layer for an n-type substrate.

3. The method according to claim 1, wherein the first insulating layer in the step of forming the first insulating layer includes a Phosphorous Silicate Glass layer for a p-type substrate.

4. The method according to claim 1, wherein the step of forming the second insulating layer includes a chemical vapor deposition process.

5. The method according to claim 1, wherein the channel stop regions in the step of annealing the second insulating layer are formed through a thermal diffusion process.

6. The method according to claim 1, wherein the buffer layer in the step of forming the buffer layer includes an oxide layer.

7. The method according to claim 1, wherein the oxide resist layer in the step of forming the oxide resist layer includes a nitride layer.

8. The method according to claim 1, wherein the step of forming the field oxide layer includes a local oxidation of silicon (LOCOS) process.

* * * * *